(12) United States Patent
Zhang et al.

(10) Patent No.: US 12,237,172 B2
(45) Date of Patent: Feb. 25, 2025

(54) ETCH PROCESS FOR OXIDE OF ALKALINE EARTH METAL

(71) Applicant: Tokyo Electron Limited, Tokyo (JP)

(72) Inventors: Du Zhang, Albany, NY (US);
Christophe Vallee, Albany, NY (US);
Mingmei Wang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 260 days.

(21) Appl. No.: 17/746,406

(22) Filed: May 17, 2022

(65) Prior Publication Data

US 2023/0374670 A1  Nov. 23, 2023

(51) Int. Cl.
| | | |
|---|---|---|
| *H01L 21/3065* | (2006.01) | |
| *C23F 1/12* | (2006.01) | |
| *C23G 5/00* | (2006.01) | |
| *H01L 21/311* | (2006.01) | |
| *H01L 21/3213* | (2006.01) | |

(52) U.S. Cl.
CPC ............ *H01L 21/3065* (2013.01); *C23F 1/12* (2013.01); *C23G 5/00* (2013.01); *H01L 21/311* (2013.01); *H01L 21/31116* (2013.01); *H01L 21/31122* (2013.01); *H01L 21/32136* (2013.01)

(58) Field of Classification Search
None
See application file for complete search history.

(56) References Cited

U.S. PATENT DOCUMENTS

| | | | |
|---|---|---|---|
| 4,430,151 A | 2/1984 | Tsukada | |
| 5,368,687 A * | 11/1994 | Sandhu | H01L 21/31122 257/E21.252 |
| 6,436,838 B1 * | 8/2002 | Ying | H01L 21/31144 438/296 |
| 7,484,513 B2 * | 2/2009 | Tada | C23C 16/045 134/1.1 |
| 8,222,132 B2 | 7/2012 | Lee et al. | |
| 2004/0007561 A1 | 1/2004 | Nallan et al. | |
| 2008/0199975 A1 | 8/2008 | Park et al. | |
| 2010/0099264 A1 * | 4/2010 | Elers | H01L 21/31122 257/E21.218 |

(Continued)

FOREIGN PATENT DOCUMENTS

| | | |
|---|---|---|
| JP | 2005252186 A | 9/2005 |
| KR | 20080076173 A | 8/2008 |
| WO | 2021202445 A1 | 10/2021 |

OTHER PUBLICATIONS

S. Kim et al., J. Vac. Sci. Technol. A, vol. 18(4), pp. 1381-1384. (Year: 2000).*

(Continued)

*Primary Examiner* — Jiong-Ping Lu
(74) *Attorney, Agent, or Firm* — Slater Matsil, LLP

(57) ABSTRACT

A method of processing a substrate that includes: loading the substrate in a plasma processing chamber, the substrate having a surface including an oxide, the oxide including an alkaline earth metal; flowing a process gas including $CCl_4$ into the plasma processing chamber; in the plasma processing chamber, forming a fluorine-free plasma from the process gas by applying a source power to a source electrode of the plasma processing chamber; and exposing the substrate to the fluorine-free plasma to etch the oxide of the surface.

18 Claims, 7 Drawing Sheets

(56) References Cited

U.S. PATENT DOCUMENTS

2011/0139748 A1* 6/2011 Donnelly .......... H01J 37/32045
216/37

OTHER PUBLICATIONS

J. Cheng et al., J. Vac. Sci. Technol. B, vol. 38(1), pp. 012201-1 to 012201-7. (Year: 2020).*

D. Wuu et al., Jpn. J. Appl. Phys. Vol. 39, pp. 2068-2072. (Year: 2000).*

K.S. Min et al., Microelectronic Engineering, vol. 114, pp. 121-125. (Year: 2014).*

K.J. Kanarik et al., J. Vac. Sci. Technol. A, vol. 33(2), pp. 020802-1 to 020802-14. (Year: 2015).*

An et al., "Effects of BCl 3 addition on Ar/Cl 2 gas in inductively coupled plasmas for lead zirconate titanate etching," Journal of Vacuum Science & Technology A vol. 18, No. 4, Jul./Aug. 2000, pp. 1373-1376, doi: 10.1116/1.582356, Nov. 8, 1999, 5 pages.

Cheng et al., "Nanoscale etching of perovskite oxides for field effect transistor applications," Journal of Vacuum Science and Techonology B 38, Dec. 18, 2019, https://doi.org/10.1116/1.5122667, 8 pages.

Eltes et al., A BaTiO3-Based Electro-Optic Pockels Modulator Monolithically Integrated on an Advanced Silicon Photonics Platform, Journal Of Lightwave Technology, vol. 37, No. 5, Mar. 1, 2019, pp. 1456-1462, 7 pages.

Hlad et al., "Dry etching of MgCaO gate dielectric and passivation layers on GaN," Applied Surface Science 252 (2006), Nov. 28, 2005, pp. 8010-8014, 5 pages.

Karvounis et al., "Barium Titanate Nanostructures and Thin Films for Photonics," Advanced Optical Materials, DOI: 10.1002/adom. 202001249, Nov. 5, 2020, 23 pages.

Koo et al., "Etching properties of lead-zirconate-titanate thin films in Cl 2 / Ar and BCl 3 / Ar gas chemistries," Journal of Vacuum Science & Technology A, vol. 22, No. 4, Jul./Aug. 2004; pp. 1519-1523, doi: 10.1116/1.1764816, Jul. 20, 2004, 6 pages.

Li et al., "Strong Pockels materials," Nature Materials, vol. 18, Jan. 2019, www.nature.com/naturematerials, https://doi.org/10.1038/s41563-018-0259-2, Dec. 12, 2018, 3 pages.

Li et al., "Comparative analysis of barium titanate thin films dry etching using inductively coupled plasmas by different fluorine-based mixture gas," Nanoscale Research Letters 2014, Sep. 26, 2014, http://www.nanoscalereslett.com/content/9/1/530, 8 pages.

Liping et al., "Etching mechanism of barium strontium titanate (BST) thin films in CHF3/Ar plasma," Chinese Science Bulletin, Jul. 2011, vol. 56, No. 21, pp. 2267-2274, doi: 10.1007/s11434-011-4561-5, 5 pages.

Min et al., "Atomic layer etching of BeO using BCl3/Ar for the interface passivation layer of II☆V MOS devices," Microelectronic Engineering 114 (2014), pp. 121-125, Oct. 2, 2013, 5 pages.

Parker et al., "High-Aspect-Ratio Inductively Coupled Plasma Etching of Bulk Titanium for Mems Applications," Jan. 2004, 12 pages.

Pearton et al., "Dry Etching of Electronic Oxides, Polymers, and Semiconductors," Plasma Processes and Polymers, 2005, 2, pp. 16-37, Sep. 30, 2004; DOI: 10.1002/ppap.200400035, 22 pages.

Werbowy et al., "Barium titanate thin films plasma etch rate as a function of the applied RF power and Ar/CF4 mixture gas mixing ratio," Phys. Stat. Sol. (c) 4, No. 4, pp. 1578-1580, Mar. 30, 2007, DOI 10.1002/pssc.200674132, 3 pages.

Wuu et al., "Etching Characteristics and Mechanism of Ba0.7Sr0.3TiO3 Thin Films in an Inductively Coupled Plasma," Jpn. J. Appl. Phys. vol. 39 (2000) pp. 2068-2072, Part 1, No. 4B, Apr. 2000, Dec. 6, 1999, 5 pages.

International Search Report and Written Opinion, PCT Application No. PCT/US2023/022386; mailed Sep. 5, 2023, 10 pages.

Kim, Seung-Bum et al., "Etching mechanism of (Ba,Sr)TiO3 films in high density Cl2/BCl3/Ar plasma," Journal of Vacuum Science & Technology A., Jul. 2000, vol. 18, No. 4, 5 pages.

* cited by examiner

ETCH PROCESS FOR OXIDE OF ALKALINE EARTH METAL

TECHNICAL FIELD

The present invention relates generally to a method of processing a substrate, and, in particular embodiments, to etching an oxide of an alkaline earth metal.

BACKGROUND

Generally, semiconductor devices used in electronics, such as mobile phones, digital cameras, and computers, are fabricated by sequentially depositing and patterning layers of dielectric, conductive, and semiconductor materials over a semiconductor substrate, using photolithography and etching to form structures that function as circuit components (e.g., transistors, resistors, and capacitors) and as interconnect elements (e.g., conductive lines, contacts and vias). Driven by a demand for low-cost electronics, the semiconductor industry has repeatedly reduced the minimum feature sizes in semiconductor devices to a few nanometers with innovations in lithography (e.g., immersion lithography and multiple patterning) to increase the packing density of components, thereby reducing the cost of integrated circuits (ICs). Further increase in density and reduction in cost is achieved using three-dimensional (3D) structures (e.g., the fin field-effect transistors (FinFET)) and, in some instances, stacking electronic components such as memory storage elements (e.g., the ferroelectric capacitor, the magnetic tunnel junction (MTJ), etc.) and precision passive components (e.g., the thin-film resistor (TFR) and the metal-insulator-metal (MIM) capacitor) in layers in between successive interconnect levels.

Plasma processing techniques, such as reactive ion etching (RIE), plasma-enhanced chemical vapor deposition (PECVD), plasma-enhanced atomic layer etch and deposition (PEALE and PEALD), sputter etch, physical vapor deposition (PVD), and cyclic etch-deposition (e.g., the Bosch etch process) have become indispensable in fabricating ICs. The diversity of materials used in IC fabrication such as semiconductors, insulators (including $SiO_2$, $Si_3N_4$, high-k gate dielectrics, and low-k dielectrics), magnetic and ferroelectric films, and metals for interconnect and electrodes makes developing plasma processes a challenge. Miniaturization to a few nanometers has intensified the challenge. The plasma processes are expected to deliver precise dimensions (e.g., linewidths, etch depth, and film thicknesses) in the nanometer range along with precisely controlled features, for example, conformality, anisotropy, selectivity, surface and line edge roughness, and edge profile, often at atomic scale dimensions, uniformly across a wide (e.g., 300 mm) wafer. Furthermore, introduction of unconventional materials (e.g., high-k dielectrics such as barium titanate) may raise new issues in developing plasma etch and deposition processes compatible with conventional Si IC fabrication.

SUMMARY

In accordance with an embodiment of the present invention, a method of processing a substrate that includes: loading the substrate in a plasma processing chamber, the substrate having a surface including an oxide, the oxide including an alkaline earth metal; flowing a process gas including $CCl_4$ into the plasma processing chamber; in the plasma processing chamber, forming a fluorine-free plasma from the process gas by applying a source power to a source electrode of the plasma processing chamber; and exposing the substrate to the fluorine-free plasma to etch the oxide of the surface.

In accordance with an embodiment of the present invention, a method of processing a substrate that includes: loading the substrate in a plasma processing chamber, the substrate having a surface including barium; flowing a process gas into the plasma processing chamber, the process gas including a mixture of $Cl_2$ and $BCl_3$; in the plasma processing chamber, forming a fluorine-free plasma from the process gas by applying a source power to a source electrode of the plasma processing chamber; and exposing the substrate to the fluorine-free plasma to etch the barium of the surface.

In accordance with an embodiment of the present invention, a method of processing a substrate that includes: loading the substrate in a plasma processing chamber, the substrate having a surface including a mixed oxide, the mixed oxide including an alkaline earth metal and another metal; and performing a plurality of cyclic processes, each of the plurality of cyclic processes including: exposing the mixed oxide to first fluorine-free species provided from a first process gas to react the mixed oxide with the first species and to form a reaction product including the alkaline earth metal; and exposing the reaction product to second fluorine-free species provided from a second process gas to remove the reaction product from the surface.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1D illustrate cross-sectional views of an example substrate during a fabrication process comprising etching a high-k dielectric (HK) layer at various stages in accordance with various embodiments, wherein FIG. 1A illustrates the incoming substrate comprising the HK layer, FIG. 1B illustrates the substrate after etching the HK layer, FIG. 1C illustrates the substrate after a spacer material deposition and a spacer top hat etch, and FIG. 1D illustrates the substrate after a source/drain formation;

FIGS. 2A-2B illustrate cross-sectional views of another example substrate comprising a high-k dielectric (HK) layer during a high-k/metal gate (HKMG) fabrication in accordance with alternate embodiments, wherein FIG. 2A illustrates the substrate after etching the HK layer, a spacer material deposition, a spacer top hat etch, a source/drain formation, dielectric deposition, and a dummy gate removal, and FIG. 2B illustrates the substrate after a metal gate formation;

FIGS. 5A-5C illustrate example process flow diagrams of etching an alkali earth metal-containing layer, wherein FIG. 5A illustrates an embodiment, FIG. 5B illustrates an alternate embodiment, and FIG. 5C illustrates yet another embodiment.

DETAILED DESCRIPTION OF ILLUSTRATIVE EMBODIMENTS

This application relates to a method of processing a substrate, more particularly to etching an oxide of an alkaline earth metal such as barium perovskite. For advanced logic and memory device design and fabrication, new materials have been proposed to replace conventional materials. For example, barium titanate ($BaTiO_3$) and similar perovskite materials are expected as promising candidates for novel high-k gate dielectric materials. However, currently there is no satisfactory etching method for these materials that is compatible with the semiconductor fabrication processes. In particular, the etching of barium titanate using a halogen-based plasma process is challenging due to low volatility of possible etch products (e.g., fluorides and chlorides). Embodiments of the present application disclose methods of fluorine-free etching of an oxide of an alkaline earth metal using chlorine (e.g., boron chloride or carbon tetrachloride), which may advantageously provide more thermodynamically favored reaction pathways and volatile etch products. Through density functional theory (DFT) calculations, the inventors of this application uncovered that some chloride compounds such as boron chloride and/or carbon tetrachloride may facilitate breaking the metal-oxygen bonds in the oxide and forming volatile etch products comprising a boron-oxygen or carbon-oxygen bond. Although the description below in this disclosure is mainly barium titanate, the methods herein may also be applied to other barium oxides, and more generally to oxides of alkaline earth metal, including mixed oxides of alkaline-earth metal and other metals. By providing new etch chemistry particularly tailored for these metal oxides, the embodiment methods may mitigate the challenges of their etching, enabling their applications as a high-k dielectric in advanced logic and memory devices.

Figure 4:
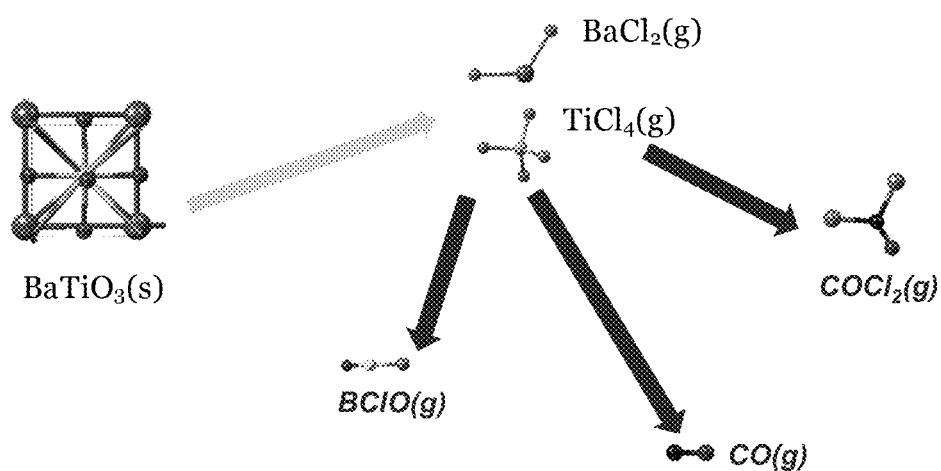
FIG. 4 illustrates alternate reaction pathway of barium titanate under an etching condition including boron or carbon with calculated reaction energies in accordance with alternate embodiments, for which reaction energies are calculated.
Figure 5A:
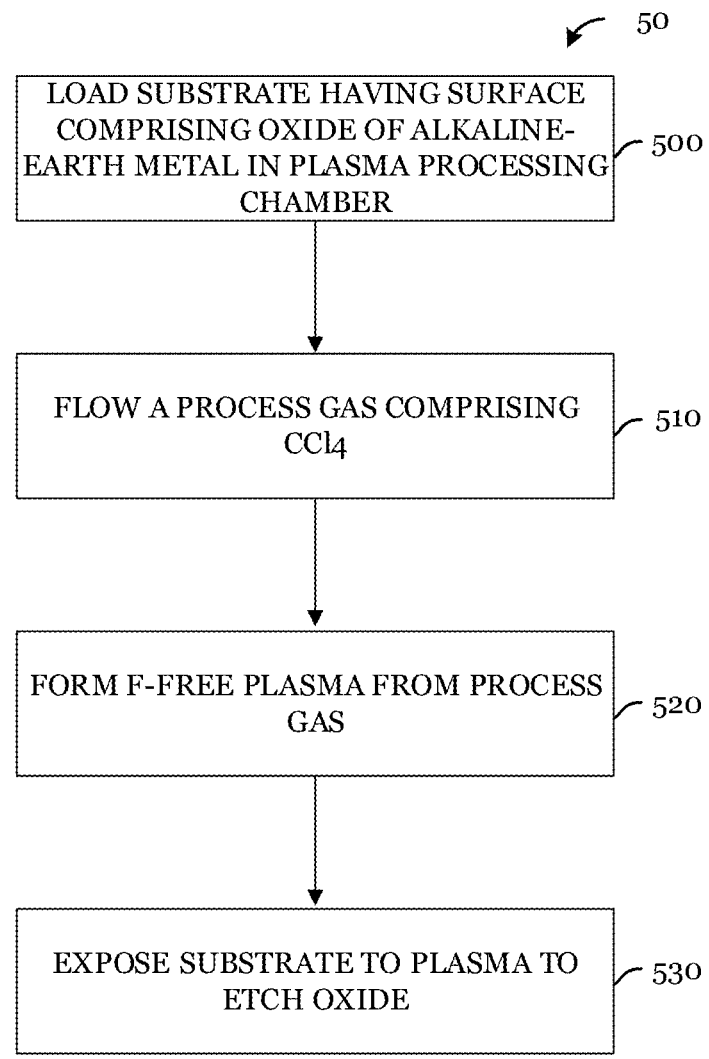
Figure 5B:
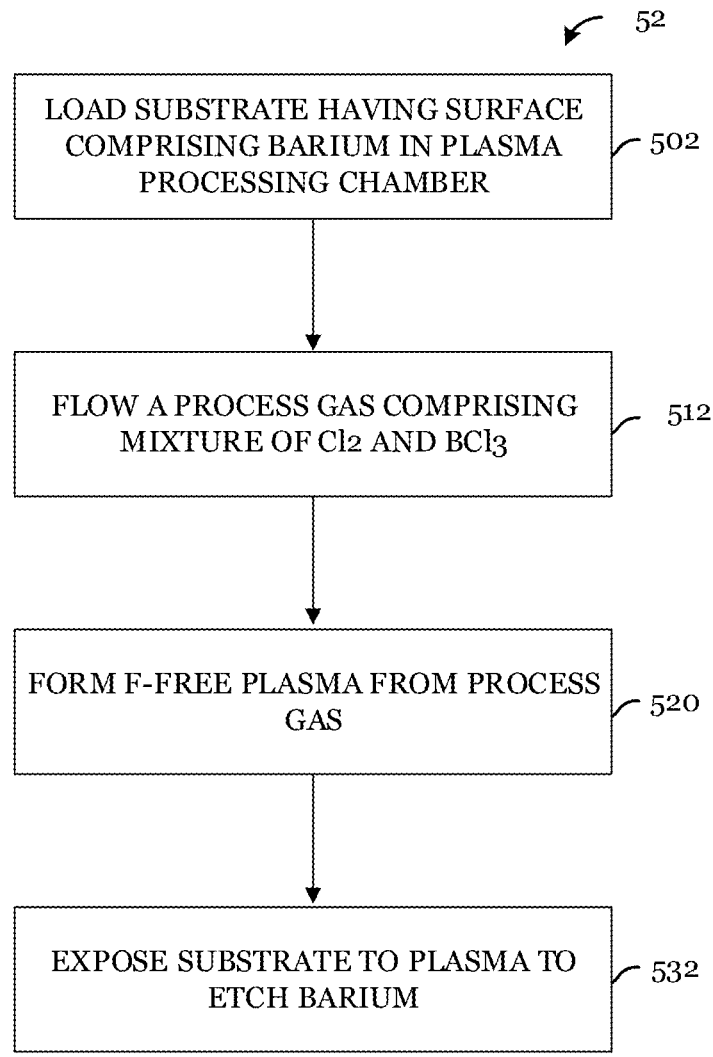
Figure 5C:
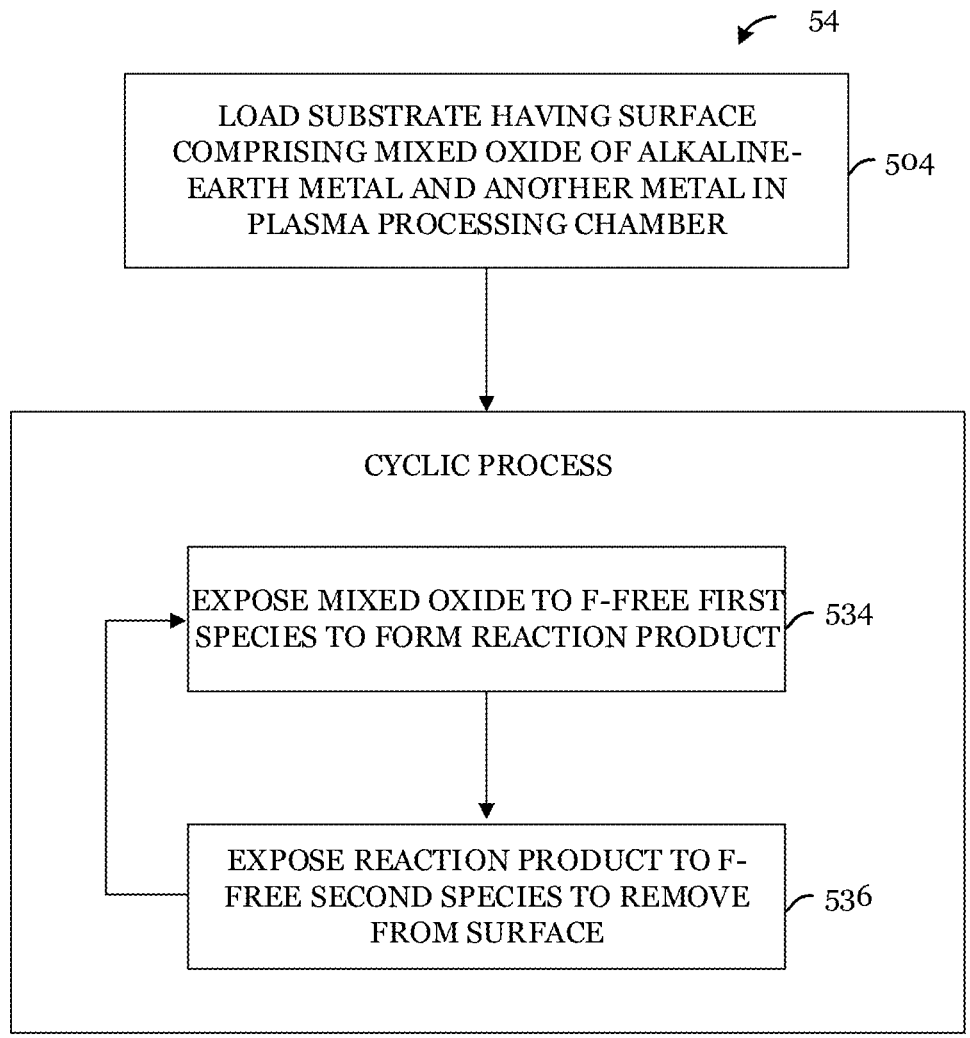

In the following, example steps of semiconductor fabrication comprising etching a high-k dielectric such as barium titanate are first described referring to FIGS. 1A-1D and 2A-2B in accordance with various embodiments. Possible reaction pathways of etching barium titanate with calculated reaction energies are then presented in FIGS. 3 and 4 to compare two example conditions: a Cl-only condition (FIG. 3) and a B/C-added condition (FIG. 4). Example process flow diagrams are illustrated in FIG. 5A-5C. All figures in this disclosure are drawn for illustration purpose only and not to scale, including the aspect ratios of features.

FIGS. 1A-1D illustrate cross-sectional views of an example substrate 100 during a fabrication process comprising etching a high-k dielectric (HK) layer no at various stages in accordance with various embodiments. In the illustrated example, a part of fabrication process for metal-oxide-semiconductor field-effect transistor (MOSFET) using a high-k material for gate dielectric is described. The methods herein, however, may be applied to any fabrication process with etching of an oxide of an alkaline earth metal, including but not limited to applications in transistors, quantum computing, and photonics.

Figure 1A:
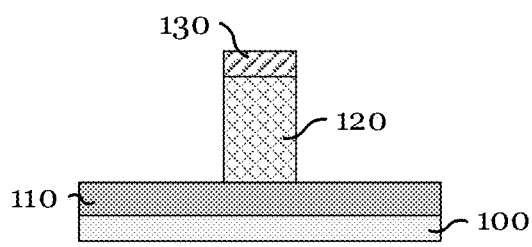

FIG. 1A illustrates the incoming substrate 100 comprising the high-k dielectric (HK) layer 110.

In various embodiments, the substrate 100 may be a part of, or includes, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device.

Over the substrate 100, the high-k dielectric (HK) layer no may be formed. In various embodiments, the HK layer no comprises a barium perovskite, including but not limited to barium titanate ($BaTiO_3$), barium-strontium titanate ($Ba_xTi_ySr_zO_m$), barium stannate ($BaSnO_3$), barium-strontium stannate ($Ba_xTi_ySr_zO_m$), and any mixtures thereof. Although their compositions may be presented with chemical formulas, the barium perovskite, or any other oxides, may not be strictly stoichiometric. In alternate embodiments, the HK layer no may comprise another oxide comprising an alkaline earth metal. The HK layer no is the layer to be etched using the embodiment method described in this disclosure, to fabricate, for example, a gate dielectric for a MOSFET. The HK layer no may be deposited over the substrate 100 using appropriate deposition techniques such as vapor deposition including atomic layer deposition (ALD), chemical vapor deposition (CVD), physical vapor deposition (PVD), as well as other plasma processes such as plasma enhanced CVD (PECVD), sputtering, and other processes. In certain embodiments, an optional insulating layer, such as a silicon oxide layer, may be formed between the substrate 100 and the HK layer 110.

Over the HK layer 110, a polysilicon layer 120 may be formed and patterned. The polysilicon used in the polysilicon layer 120 may comprise a doped polysilicon to have desired material properties including electrical properties. The polysilicon layer 120 may be deposited over the HK layer no using appropriate deposition techniques such as vapor deposition including chemical vapor deposition (CVD), physical vapor deposition (PVD), as well as other plasma processes such as plasma enhanced CVD (PECVD), sputtering, and other processes. In one or more embodiments, the polysilicon layer 120 may have a thickness of about 50 nm to about 500 nm.

In various embodiments, the polysilicon layer 120 is patterned to form a gate structure or a dummy gate structure for a semiconductor device. Accordingly, the polysilicon layer 120 may be patterned into a fin, a pillar, or any suitable shape. The patterning of the polysilicon layer 120 may be performed using a plasma dry etch process, for example a reactive ion etching (RIE) process. A hard mask layer 130 may be used as an etch mask during such an etch process for the polysilicon layer 120.

Still referring to FIG. 1A, the hard mask layer 130 may comprise silicon oxide in one embodiment. In various embodiments, the hard mask layer 130 may comprise silicon nitride, silicon carbonitride (SiCN), or silicon oxycarbide (SiOC). In alternate embodiments, the hard mask layer 130 may comprise titanium nitride. In one or more embodiments, the hard mask layer 130 may comprise other suitable organic materials such as spin-on carbon hard mask (SOH) materials. Further, the hard mask layer 130 may be a stacked hard mask comprising, for example, two or more layers using two different materials. In some of such embodiments, the first hard mask of the hard mask layer 130 may comprise a metal-based layer such as titanium nitride, titanium, tantalum nitride, tantalum, tungsten based compounds, ruthenium based compounds, or aluminum based compounds, and the second hard mask material of the hard mask layer 130 may comprise a dielectric layer such as silicon oxide, silicon nitride, SiCN, SiOC, silicon oxynitride, or silicon carbide. The hard mask layer 130 may be deposited using suitable deposition techniques such as vapor deposition including chemical vapor deposition (CVD), physical vapor deposition (PVD), as well as other plasma processes such as plasma enhanced CVD (PECVD), sputtering, and other processes including wet processes. The hard mask layer 130 may have a thickness of about 5 nm to about 50 nm in various embodiments. In one or more embodiments, an additional layer such as silicon-containing anti-reflective coating films (SiARC) or other ARC films may be formed over the hard mask layer 130. In further embodiments, a photoresist that may have been used to pattern the hard mask layer 130 by lithography may be left over the hard mask layer 130.

Figure 1B:
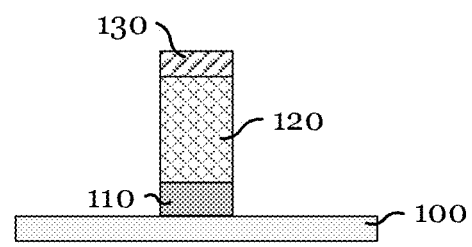

FIG. 1B illustrates the substrate 100 after etching the high-k dielectric (HK) layer no.

In various embodiments, the etching of the HK layer no may be performed using a chlorine-based plasma dry etch process in a plasma processing chamber. In certain embodiments, an etch gas may comprise boron chloride ($BCl_3$) or carbon tetrachloride ($CCl_4$). In one or more embodiments, the etch gas may comprise dichlorine ($Cl_2$). In addition to the chlorine, the etch gas may further comprise a noble gas (e.g., Ar, He, Xe, etc.). In one embodiment, for example, the etch gas may be a mixture of $Ar/Cl_2/BCl_3$ or $Ar/Cl_2/CCl_4$. In other embodiments, the etch gas may comprise other halogens except fluorine. For example, the etch gas may comprise $BBr_3$, $BBr_2Cl$, $BBrCl_2$, $CBr_4$, $CBr_3Cl$, $CBr_2Cl_2$, or $CBrCl_3$. In alternate embodiments, the etch gas may comprise $N_2$, $SO_2$, or COS. Further, in one or more embodiments, the etch gas may comprise any molecules that may react with oxygen from the surface, including but not limited to CO, $CO_2$, NO, and $NO_2$. As further described below referring to FIGS. 3-4, using boron chloride, tetrachloride, or both in the etch gas may be uniquely advantageous compared to using dichlorine alone, because such chlorides can facilitate the breakage of metal-oxygen bonds of the dielectric material of the HK layer no and form volatile etch products (e.g., BOCl, CO, and $COCl_2$) in addition to other chloride etch products (e.g., $BaCl_2$ and $TiCl_4$). In various embodiments, the etch gas and the plasma formed from the etch gas may be essentially fluorine-free to avoid the formation of a metal fluoride such as barium fluoride, which may have a lower volatility than a metal chloride. While chlorine-based plasma processes are commonly employed for etching various materials, etching of metal oxides of alkaline earth metals have been difficult mainly due to low volatility of etch products. The inventors of this application identified only certain specific gases (e.g., $BCl_3$ and $CCl_4$) may be able to improve the etching of such metal oxides, when used alone or in combination with other chlorine-containing gases (e.g., $Cl_2$), owing to the ability of boron or carbon in the etch gas to form bonding with metal atoms of the metal oxides on surface.

In certain embodiments, the etch gas and the plasma formed from the etch gas may also be essentially hydrogen-free to avoid the formation of water or other hydrogen-containing products. Water molecules may not be desirable in certain embodiments as they may easily react with some etch products such as $TiCl_4$ and form a deposit such as titanium oxide through hydrolysis. Accordingly, in one or more embodiments, to eliminate fluorine and hydrogen from the plasma for etching, fluorocarbon (e.g., $CF_4$) and hydrofluorocarbon (e.g., $CHF_3$) may be avoided as a constituent of the etch gas. Similarly, other halogen compounds containing hydrogen such as chloromethane ($CH_3Cl$), dichloromethane ($CH_2Cl_2$), and chloroform ($CHCl_3$), may be avoided in certain embodiments. In this disclosure, a fluorine-free plasma and a hydrogen-free plasma refer to plasmas that contains no fluorine or hydrogen, respectively, or plasmas in which the concentrations of fluorine or hydrogen are substantially less than any amount that may cause a chemical or physical effect in the process.

In certain embodiments, the noble gas component of the etch gas may provide additional ion bombardment with ions (e.g., argon ions Ark) to cause some damage and enhance the etching by removing the etch products from the surface of the HK layer no. The ions in the plasma are accelerated towards the substrate by a vertical electric field in the sheath region. The strength of the vertical electric field may be adjusted by a bias voltage supplied to a substrate holder. For example, the $Ar^+$ ions, being relatively massive (40 amu), may impinge on the etch products (e.g., $BaCl_2$) formed on the surface and remove them from the surface, even for energies too low to cause significant sputtering of the HK layer no.

In alternate embodiments, the fluorine-free, chlorine-based plasma dry etch process for the HK layer no may be performed as a cyclic process of atomic layer etching (ALE) or in a quasi-ALE fashion. A first step of the cyclic process (reaction step) is to react the surface of the HK layer no, which may or may not be a monolayer, with one or more chlorine compounds (e.g., $Cl_2$ and $BCl_3$) as described in the prior embodiments. After the first step, while some etch products may be directly formed as gaseous products (e.g., BClO), some of the etch products (e.g., $BaCl_2$, $TiCl_4$) may remain on the surface due to relatively low volatility. A second step of the cyclic process (removal step) is to treat the substrate by a plasma optimized for removing these remaining etch products. In various embodiments, desired plasma conditions for this second step (removal step) may comprise high bias power to enable high ion bombarding energy ($E_i$), while the first step (reaction step) may comprise low bias power and low $E_i$. The second step may use a process gas same as the etch gas or different from the etch gas. In one or more embodiments, the etch gas for the first step may comprise may be a mixture of $Ar/Cl_2/BCl_3$ or $Ar/Cl_2/CCl_4$, while the process gas for the second step may comprise a noble gas without a halogen. In one or more embodiments, the cyclic embodiments of the fluorine-free, chlorine-based plasma dry etch process may further comprise an additional step, with or without using a plasma, such as a purge step using an inert gas. For example, a purse step may be inserted between the reaction step and the removal step in each cycle.

The plasma for etching the HK layer no may be generated from the etch gas in the plasma processing chamber by applying source power to a source electrode of the plasma processing chamber. The embodiment methods may be performed in a suitable plasma processing chamber equipped with one or more plasma sources such as inductively coupled plasma (ICP), capacitively couple plasma (CCP), microwave plasma (MW), surface wave plasma (SWP), or others. The process conditions for the plasma etching may be selected such that an anisotropic, selective etching may be enabled. As a result, as illustrated in FIG.

1B, the pattern of the polysilicon layer 120 can be transferred to the HK layer no. A chamber pressure, for example, may affect the etching rate by shifting the adsorption equilibrium of etch products. A relatively low chamber pressure can favor the desorption of the etch products from the surface. A chamber pressure may be 1000 mTorr or lower in one embodiment, but 20 mTorr or lower in another embodiment. A source power of 20 W or greater, and a bias voltage of 10 V or greater may be used in one embodiment. In one embodiment, the bias voltage may be 5000 V or less. In various embodiments, the source power and bias voltage may be high enough to enable sufficient ion bombardment on the surface, while the bias voltage also enabling anisotropy of the etching. In certain embodiments, physical sputtering may contribute to the etching of the HK layer no if a sufficient ion bombarding energy ($E_i$) is provided. In various embodiments, the substrate temperature may be kept at any reasonable temperature.

Although not described herein, embodiments of the present invention may be also applied to remote plasma systems as well as batch systems. For example, the substrate holder may be able to support a plurality of wafers that are spun around a central axis as they pass through different plasma zones. The use of a system with multiple plasma zones may advantageously enable various cyclic embodiments of the etch method.

In certain embodiments, the fluorine-free, chlorine-based plasma dry etch process for etching the HK layer no may be performed using two or more plasma conditions, where one condition enables the surface reaction of the HK layer no with the species provided from the plasma and another condition enables efficient removal of the etch products from the surface. In one or more embodiments, source/bias power pulsing, chamber pressure and temperature throttling, and/or gas flow rate adjustment may be used to enable such conditions. The substrate 100 may repeatedly be processed under each of these conditions as a part of a cyclic process to improve the etching rate and selectivity. For example, for the removal of the etch products, a higher temperature and a lower chamber pressure may be advantageous. A relatively high bias voltage may also enhance the effect of ion bombardment on the surface. Further, it is possible to combine multiple plasma conditions with changing the etch gas compositions as described in prior embodiments to perform an ALE or quasi-ALE process.

Figure 1C:
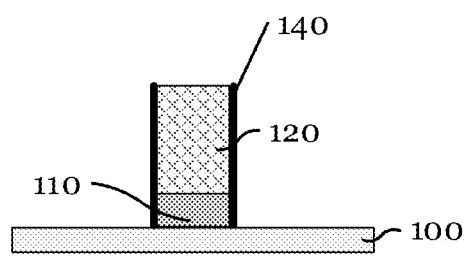

FIG. 1C illustrates the substrate 100 after a spacer material deposition and a spacer top hat etch.

After etching the high-k dielectric (HK) layer 110, subsequent process steps may be performed to continue fabricating a MOSFET. A gate spacer material 140, for example silicon nitride, may be deposited over the substrate 100 using appropriate deposition techniques such as vapor deposition including atomic layer deposition (ALD), chemical vapor deposition (CVD), physical vapor deposition (PVD), as well as other plasma processes such as plasma enhanced CVD (PECVD), sputtering, and other processes. Subsequently, top surfaces of the gate spacer material 140 may be removed by the spacer top hat etch using a plasma dry etch process, for example, a reactive ion etching (RIE) process.

Figure 1D:
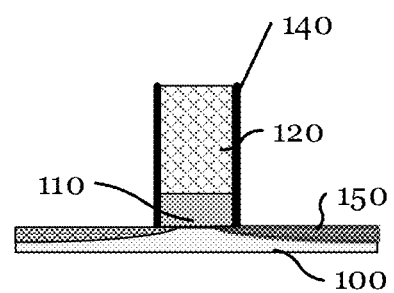

FIG. 1D illustrates the substrate 100 after a source/drain formation.

In FIG. 1D, source/drain regions 150 may be formed adjacent to the gate structure by ion implantation in the substrate 100. Ion implantation may implant dopant atoms into the substrate 100 to alter the electronic structure and properties of the implanted regions. In an ion implantation process, ions are provided by an ion source and then electrostatically accelerated to impinge on the substrate 100. Various dopants may be used for the source/drain formation, including p-type dopants (e.g., boron) and n-type dopants (e.g., phosphorous). Doping may also be realized by other techniques such as gas cluster ion beam (GCIB) and atomic layer deposition (ALD).

After the source/drain formation, other fabrication process steps such as metallization and other middle-of-line (MOL)/back-end-of-line (BEOL) processes may be performed. In the illustrated example above, the polysilicon is used as the gate material but in other embodiments, other MOSFET device structures, for example those using a non-silicon gate material, may be fabricated.

Figures 2A, 2B:
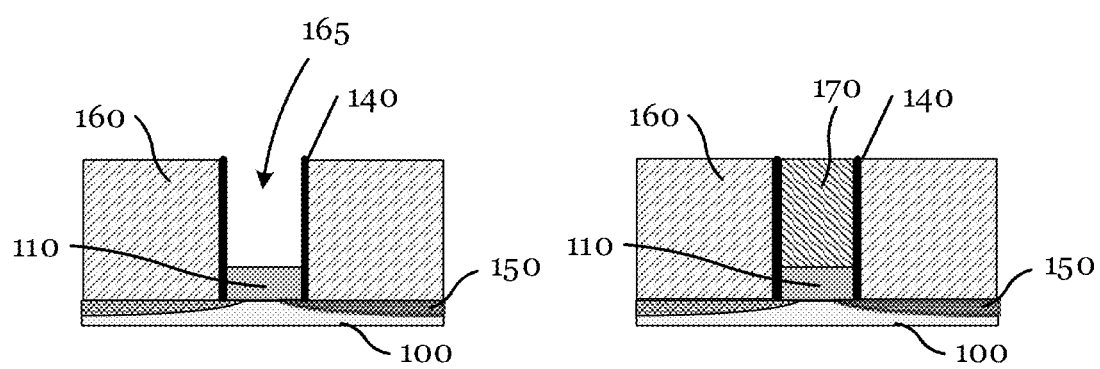

FIGS. 2A-2B illustrate cross-sectional views of another example substrate 100 comprising a high-k dielectric (HK) layer no during a high-k/metal gate (HKMG) fabrication in accordance with alternate embodiments, where a polysilicon is used as a dummy gate and replaced with a metal gate. In this illustrated example, the substrate 100 has the same initial structure as the prior embodiments illustrated in FIGS. 1A, followed by the same steps as described referring to FIGS. 1B-1D, and thus the details of the structure and these steps identical to the prior embodiments will not be repeated.

FIG. 2A illustrates the substrate after etching the HK layer no, a spacer material deposition, a spacer top hat etch, a source/drain formation, dielectric deposition, and a dummy gate removal.

In FIG. 2A, the substrate 100 having the same structure as illustrated in FIG. 1A is fabricated by the steps described above (i.e., etching of the HK layer no in FIG. 1B, the spacer material deposition and the spacer top hat etch in FIG. 1C, and the source/drain formation in FIG. 1D). Following these steps, a low-k dielectric 160 may be deposited over the substrate 100, and the polysilicon layer 120 (illustrated in FIGS. 1A-1D) may be removed (the dummy gate removal), making a recess 165 for a replacement metal gate (RMG) material 170 to fill in (e.g., FIG. 2B). The low-k dielectric 160 may comprise a silicon-based dielectric material with a low dielectric constant (i.e., low-k value) such as organosilicate glass (SiCOH), dense SiCOH, porous SiCOH, and other porous dielectric materials. The low-k dielectric may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes.

Still referring to FIG. 2A, the polysilicon layer 120 may be removed using a plasma dry etch process, for example a reactive ion etching (RIE) process that selectivity removes polysilicon. In various embodiments, the RIE process for the polysilicon layer 120 may use an etch gas, for example, comprising a halogen gas. In certain embodiments, the etch gas may comprise hydrogen bromide (HBr) and dichlorine ($Cl_2$). The etch gas may also comprise additive gases such as dioxygen ($O_2$) and/or noble gas (e.g., He, Ne, Ar, Kr, etc.). The etch gas and process conditions may be selected so that the first plasma to etch polysilicon has high selectivity and high polysilicon etch rate.

FIG. 2B illustrates the substrate 100 after a metal gate formation.

After the dummy gate removal, the recess 165 may be filled with the replacement metal gate (RMG) material 170. In various embodiments, the RMG material 170 may comprise a combination of several layers, including a workfunction metal and a metallic fill. The workfunction metal of the RMG material may comprise titanium nitride, tantalum nitride, or metal alloys such as AlC, TiAl and TiAlC. The workfunction metal for an n-type FET is generally different from that for a p-type FET in order to select different threshold voltages for the different types of FET. Metal deposition is continued till the recess 165 are filled with excess metallic fill material. In some embodiments, the metallic fill material may comprise a low resistivity metal, for example, tungsten (W), copper (Cu), cobalt (Co), or aluminum (Al). In some embodiments, the RMG material 170 may be deposited over the substrate 100 using a highly conformal process such as an atomic layer deposition (ALD) process.

After filling the recess 165 with the RMG material 170, any excess metal may be removed by a planarizing process (e.g., a chemical mechanical planarization process. The resulting top surface comprises the RMG material 170, the low-k dielectric 160, and the tops of the gate spacer material 140. Subsequently, middle-of-line (MOL)/back-end-of-line (BEOL) processes may be performed.

In the following, referring to FIGS. 3 and 4, the effect of adding a boron- or carbon-containing agent in the etch gas is described through the comparison of calculated reaction energies.

Figure 3:
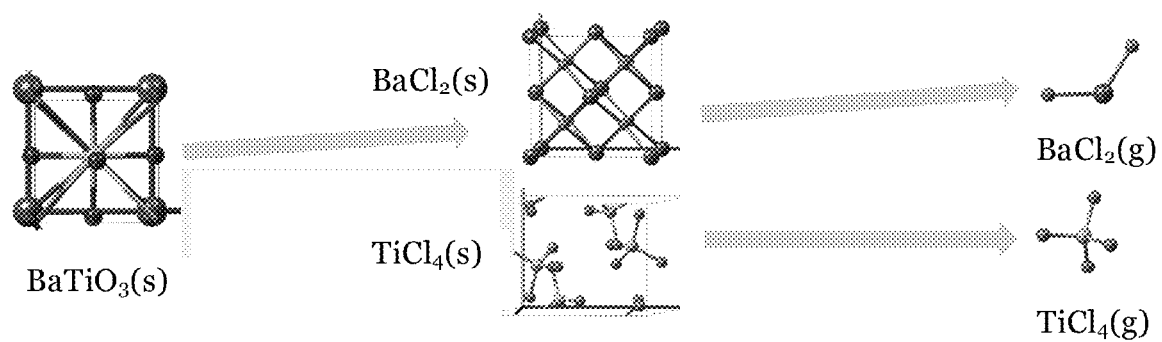
FIG. 3 illustrates a reaction pathway of barium titanate under an etching condition in accordance with one embodiment, for which reaction energies are calculated.

FIG. 3 illustrates a reaction pathway of barium titanate under an etching condition in accordance with one embodiment.

In FIG. 3, the etching of barium titanate is assumed to proceed through reactions with chlorine species from the plasma. Based on a density functional theory (DFT) calculation, reaction energies for three reaction steps are obtained as below.

$$BaTiO_3(s)+6Cl(g)=BaCl_2(s)+TiCl_4(s)+3O(g); \quad \Delta E=0.857 \text{ eV} \tag{1}$$

$$BaCl_2(s)=BaCl_2(g); \Delta F=2.883 \text{ eV} \tag{2a}$$

$$TiCl_4(s)=TiCl_4(g); \Delta F=0.0054 \text{ eV} \tag{2b}$$

The reaction (1), the surface reaction of barium titanate to form solid barium chloride ($BaCl_2$), solid titanium chloride ($TiCl_2$) and oxygen atoms, is shown to be only slightly endothermic (almost thermodynamically neutral) with the reaction energy of 0.857 eV. Furthermore, the DFT calculation indicated that forming $BaCl_2$ in the gas phase (2a) requires a substantial energy (2.883 eV), which means $BaCl_2$ is only moderately volatile. On the other hand, $TiCl_2$ is highly volatile with a minimal energy difference between the solid and gaseous phases (0.054 eV). This result demonstrates the difficultly of removing the etch products form the surface, particularly $BaCl_2$. In other words, the barium-oxygen bonds of $BaTiO_3$ are so stable and requires significant energy to break. Accordingly, a fluorine-free, chlorine-based plasma etch process that only provides chlorine (e.g., $Cl_2$ alone) may not be able to effectively etch $BaTiO_3$. It should be noted, however, that a chlorine-based plasma etch process may still be advantageous compared to a fluorine-based plasma etch process because barium and titanium fluorides are even less volatile (i.e., harder to remove from the surface). Accordingly, in various embodiment, the etch gas comprise a halogen other than fluorine (e.g., chlorine and bromine).

FIG. 4 illustrates alternate reaction pathway of barium titanate under an etching condition including boron or carbon in accordance with alternate embodiments.

In FIG. 4, three additional DFT calculations that include reactions with boron or carbon demonstrate that the difficulty of etching $BaTiO_3$ may be mitigated by enabling new oxygen-containing etch products. The three additional reactions illustrated in FIG. 4 are the reactions of oxygen atoms with (A) boron chloride ($BCl_3$), (B) carbon, and (C) dichloromethylene (CCL), which produce oxygen-containing etch products of BClO, CO, and $COCl_2$, respectively. All reactions calculated exhibited substantial negative reaction energy ranging between about −35.1 eV and −23.5 eV as shown below as (A)-(C), together with (1) the initial reaction with chlorine.

$$BaTiO_3(s)+6Cl(g)=BaCl_2(g)+TiCl_4(g)+3 \text{ O}(g); \quad \Delta E=3.795 \text{ eV} \tag{1}$$

$$3O(g)+3BCl(g)=3BClO(g); \Delta E=-26.964 \text{ eV} \tag{A}$$

$$3 \text{ O}(g)+3 \text{ C}(g)=3 \text{ CO}(g); \Delta E=-35.092 \text{ eV} \tag{B}$$

$$3O(g)+3CCl_2(g)=3COCl_2(g); \Delta E=-23.538 \text{ eV} \tag{C}$$

The magnitude of these values are substantially greater than a moderate positive reaction energy for (1) the formation of $BaCl_2$, $TiCl_4$, and oxygen atoms (i.e., 3.795 eV) through reacting $BaTiO_3$ with chlorine. Therefore, coupling the etching of $BaTiO_3$ with one or more of the additional reactions can make the overall reaction thermodynamically favored (i.e., exothermic). In other words, adding boron or carbon in the etch gas may substantially improve the etching of $BaTiO_3$ by breaking the barium-oxygen bonds and forming stable etch products with boron-oxygen or carbon-oxygen bonds. In these etch products, the bond order of these bonds may be any reasonable value. In other words, in various embodiments, a single, double, and/or triple bond with oxygen may be formed. In order to enable these etch products, the etch gas may thereby comprise, in addition to chlorine, boron or carbon. In various embodiments, boron chloride ($BCl_3$) or carbon tetrafluoride ($CCl_4$) may be used alone as an etch gas, or as an additive to the etch gas comprising another chlorine source such as dichlorine ($Cl_2$). In certain embodiments, other molecules may also be included in the etch gas to facilitate the barium-oxygen bond breakage by providing a new oxygen-containing etch product. Such molecules may be including but not limited to $N_2$, $SO_2$, COS, NO, $NO_2$, CO, $CO_2$, $BBr_3$, $BBr_2Cl$, $BBrCl_2$, $CBr_4$, $CBr_3Cl$, $CBr_2Cl_2$, or $CBrCl_3$.

FIGS. 5A-5C illustrate process flow charts of methods of etching barium titanate or similar oxides in accordance with various embodiments.

In FIG. 5A, a process flow 50 starts with loading a substrate in a plasma processing chamber, where the substrate has a surface comprising an oxide of an alkaline earth metal (block 500, FIG. 1A). Next, a process gas comprising carbon tetrachloride ($CCl_4$) may be flowed into the plasma processing chamber (block 510), and a fluorine-free plasma may be formed from the process gas by applying a source power to a source electrode of the plasma processing chamber (block 520, FIG. 1B). The substrate may then be exposed to the plasma to etch the oxide of the surface (block 530, FIG. 1B).

In FIG. 5B, a process flow 52 starts with loading a substrate in a plasma processing chamber, where the substrate has a surface comprising barium, for example, barium titanate (block 502, FIG. 1A). Next, a process gas comprising a mixture of dichloride ($Cl_2$) and boron chloride ($BCl_3$) may be flowed into the plasma processing chamber (block 512), and a fluorine-free plasma may be formed from the process gas by applying a source power to a source electrode of the plasma processing chamber (block 520, FIG. 1B). The substrate may then be exposed to the plasma to etch the barium of the surface (block 532, FIG. 1B).

In FIG. 5C, a process flow 54 starts with loading a substrate in a plasma processing chamber, where the substrate has a surface comprising a mixed oxide that includes an alkaline earth metal and another metal (block 504, FIG. 1A). Next, a cyclic process may be performed. The cyclic process may comprise first exposing the mixed oxide to first fluorine-free species provided from a first process gas to react the mixed oxide with the first species and to form a reaction product comprising the alkaline earth metal (block 534, FIG. 1B), and subsequently exposing the reaction product to second fluorine-free species provided from a second process gas to remove the reaction product from the surface (block 536, FIG. 1B).

Example embodiments of the invention are summarized here. Other embodiments can also be understood from the entirety of the specification as well as the claims filed herein.

Example 1. A method of processing a substrate that includes: loading the substrate in a plasma processing chamber, the substrate having a surface including an oxide, the oxide including an alkaline earth metal; flowing a process gas including $CCl_4$ into the plasma processing chamber; in the plasma processing chamber, forming a fluorine-free plasma from the process gas by applying a source power to a source electrode of the plasma processing chamber; and exposing the substrate to the fluorine-free plasma to etch the oxide of the surface.

Example 2. The method of example 1, where the plasma is hydrogen-free.

Example 3. The method of one of examples 1 or 2, further including flowing a noble gas into the plasma processing chamber.

Example 4. The method of one of examples 1 to 3, where the process gas further including $Cl_2$, $BCl_3$, $BCl_2Br$, $BClBr_2$, or $BBr_3$.

Example 5. The method of one of examples 1 to 4, where the process gas further including, $N_2$, NO, $NO_2$, CO, $CO_2$, $SO_2$, or COS.

Example 6. The method of one of examples 1 to 5, where etching the oxide includes forming a volatile product including a carbon-oxygen bond.

Example 7. The method of one of examples 1 to 6, where the oxide is barium titanate.

Example 8. The method of one of examples 1 to 7, where the oxide is barium strontium titanate.

Example 9. The method of one of examples 1 to 8, where the oxide is barium stannate.

Example 10. The method of one of examples 1 to 9, where the alkali earth metal is calcium (Ca) or magnesium (Mg), and the oxide is a titanate perovskite.

Example 11. A method of processing a substrate that includes: loading the substrate in a plasma processing chamber, the substrate having a surface including barium; flowing a process gas into the plasma processing chamber, the process gas including a mixture of $Cl_2$ and $BCl_3$; in the plasma processing chamber, forming a fluorine-free plasma from the process gas by applying a source power to a source electrode of the plasma processing chamber; and exposing the substrate to the fluorine-free plasma to etch the barium of the surface.

Example 12. The method of example ii, where the fluorine-free plasma is hydrogen-free.

Example 13. The method of one of examples 11 or 12, further including flowing a noble gas into the plasma processing chamber.

Example 14. The method of one of examples 11 to 13, where the surface further including oxygen, and where etching the barium includes forming a volatile product including a boron-oxygen bond.

Example 15. A method of processing a substrate that includes: loading the substrate in a plasma processing chamber, the substrate having a surface including a mixed oxide, the mixed oxide including an alkaline earth metal and another metal; and performing a plurality of cyclic processes, each of the plurality of cyclic processes including: exposing the mixed oxide to first fluorine-free species provided from a first process gas to react the mixed oxide with the first species and to form a reaction product including the alkaline earth metal; and exposing the reaction product to second fluorine-free species provided from a second process gas to remove the reaction product from the surface.

Example 16. The method of example 15, further including forming a first plasma to generate the first fluorine-free species.

Example 17. The method of one of examples 15 or 16, where the first process gas includes halogen other than fluorine.

Example 18. The method of one of examples 15 to 17, where the first process gas includes $BCl_3$, $BCl_2Br$, $BClBr_2$, $BBr_3$, $CCl_4$, $CCl_3Br$, $CCl_2Br_2$, $CClBr_3$, or $CBr_4$, and where the first process gas further includes, $N_2$, NO, $NO_2$, CO, $CO_2$, $SO_2$, or COS.

Example 19. The method of one of examples 15 to 18, further including forming a second plasma to generate the second fluorine-free species, where the second process gas includes a noble gas.

Example 20. The method of one of examples 15 to 19, where each of the plurality of cyclic processes further includes purging the plasma processing chamber to remove the first species before exposing the reaction product to the second species.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
    loading the substrate in a plasma processing chamber, the substrate having a surface comprising barium titanate ($BaTiO_3$) or barium stannate ($BaSnO_3$);
    flowing a process gas comprising $CCl_4$ and a bromine-containing gas into the plasma processing chamber;
    in the plasma processing chamber, forming a fluorine-free plasma from the process gas by applying a source power to a source electrode of the plasma processing chamber, wherein the plasma is hydrogen-free; and
    exposing the substrate to the hydrogen-free and fluorine-free plasma to etch the $BaTiO_3$ or $BaSnO_3$.

2. The method of claim 1, further comprising flowing a noble gas into the plasma processing chamber.

3. The method of claim 1, wherein the process gas further comprising $Cl_2$, or wherein the bromine-containing gas comprises $BCl_2Br$, $BClBr_2$, or $BBr_3$.

4. The method of claim 1, wherein the process gas further comprising, $N_2$, NO, $NO_2$, CO, $CO_2$, $SO_2$, or COS.

5. The method of claim 1, wherein etching the $BaTiO_3$ comprises forming a volatile product comprising a carbon-oxygen bond.

6. The method of claim 1, wherein the $BaTiO_3$ or $BaSnO_3$ is $BaTiO_3$.

7. The method of claim 1, wherein the $BaTiO_3$ or $BaSnO_3$ is $BaSnO_3$.

8. A method of processing a substrate, the method comprising:
   loading the substrate in a plasma processing chamber, the substrate having a surface comprising barium;
   flowing a process gas into the plasma processing chamber, the process gas comprising a mixture of $Cl_2$, $BCl_3$, and a bromine-containing gas;
   in the plasma processing chamber, forming a fluorine-free plasma from the process gas by applying a source power to a source electrode of the plasma processing chamber; and
   exposing the substrate to the fluorine-free plasma to etch the barium of the surface.

9. The method of claim 8, wherein the fluorine-free plasma is hydrogen-free.

10. The method of claim 8, further comprising flowing a noble gas into the plasma processing chamber.

11. The method of claim 8, wherein the surface further comprising oxygen, and wherein etching the barium comprises forming a volatile product comprising a boron-oxygen bond.

12. A method of processing a substrate, the method comprising:
   loading the substrate in a plasma processing chamber, the substrate having a surface comprising barium titanate ($BaTiO_3$) or barium stannate ($BaSnO_3$); and
   performing a plurality of cyclic processes, each of the plurality of cyclic processes comprising:
      exposing the $BaTiO_3$ or $BaSnO_3$ to first fluorine-free species provided from a first process gas to react the $BaTiO_3$ or $BaSnO_3$ with the first fluorine-free species and to form a reaction product comprising the barium; and
      exposing the reaction product to second fluorine-free species provided from a second process gas to remove the reaction product from the surface, wherein the first process gas comprises $N_2$, NO, $NO_2$, CO, $CO_2$, $SO_2$, or COS.

13. The method of claim 12, further comprising forming a first plasma to generate the first fluorine-free species.

14. The method of claim 12, wherein the first process gas comprises halogen other than fluorine.

15. The method of claim 12, wherein the first process gas further comprises $BCl_3$, $BCl_2Br$, $BClBr_2$, $BBr_3$, $CCl_4$, $CCl_3Br$, $CCl_2Br_2$, $CClBr_3$, or $CBr_4$.

16. The method of claim 12, further comprising forming a second plasma to generate the second fluorine-free species, wherein the second process gas comprises a noble gas.

17. The method of claim 12, wherein each of the plurality of cyclic processes further comprises purging the plasma processing chamber to remove the first fluorine-free species before exposing the reaction product to the second fluorine-free species.

18. The method of claim 12, wherein the surface comprising barium titanate ($BaTiO_3$) is free of strontium.

* * * * *